United States Patent
Marakhtanov et al.

(10) Patent No.: US 10,304,662 B2
(45) Date of Patent: *May 28, 2019

(54) MULTI REGIME PLASMA WAFER PROCESSING TO INCREASE DIRECTIONALITY OF IONS

(71) Applicant: Lam Research Corporation, Fremont, CA (US)

(72) Inventors: Alexei Marakhtanov, Albany, CA (US); Lin Zhao, Fremont, CA (US); Felix Kozakevich, Sunnyvale, CA (US); Kenneth Lucchesi, Newark, CA (US); Zhigang Chen, Campbell, CA (US); John Patrick Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/008,529

(22) Filed: Jun. 14, 2018

(65) Prior Publication Data

US 2019/0080885 A1 Mar. 14, 2019

Related U.S. Application Data

(63) Continuation of application No. 15/703,280, filed on Sep. 13, 2017, now Pat. No. 10,002,746.

(51) Int. Cl.
*H01J 37/00* (2006.01)
*H01J 37/32* (2006.01)

(52) U.S. Cl.
CPC .... *H01J 37/32183* (2013.01); *H01J 37/3244* (2013.01); *H01J 37/3255* (2013.01); *H01J 2237/334* (2013.01)

(58) Field of Classification Search
CPC .. H01J 37/00; H01J 37/32183; H01J 37/3244; H01J 37/3255; H01J 37/32357; H01J 2237/332; H01J 2237/33; H01J 2237/334
See application file for complete search history.

(56) References Cited

U.S. PATENT DOCUMENTS

| | | | | |
|---|---|---|---|---|
| 9,852,889 B1 * | 12/2017 | Kellogg | ............ | H01J 37/32091 |
| 2005/0039682 A1 * | 2/2005 | Dhindsa | ............ | H01J 37/32082 118/723 E |
| 2013/0260567 A1 * | 10/2013 | Marakhtanov | .... | H01J 37/32165 438/710 |

* cited by examiner

*Primary Examiner* — Thai Pham
(74) *Attorney, Agent, or Firm* — Penilla IP, APC

(57) ABSTRACT

Systems and methods for providing a multi regime plasma wafer processing are described. The systems and methods have three states. During a first one of the states, an etching operation is performed. In a second one of the states, a power level of a kilohertz radio frequency signal is greater than zero to increase directionality of ions that are incident on a bottom surface of a stack layer. In a third one of the states, there is a reduction in a loss of mask on top of the stack layer and deposition may be performed.

26 Claims, 7 Drawing Sheets

MULTI REGIME PLASMA WAFER PROCESSING TO INCREASE DIRECTIONALITY OF IONS

CLAIM OF PRIORITY

This application is a continuation of and claims the benefit of and priority, under 35 U.S.C. § 120, to U.S. patent application Ser. No. 15/703,280, filed on Sep. 13, 2017, and titled "Multi Regime Plasma Wafer Processing To Increase Directionality of Ions", which is hereby incorporated by reference in its entirety.

FIELD

The present embodiments relate to multi regime plasma wafer processing to increase directionality of ions.

BACKGROUND

In some plasma processing systems, a radio frequency (RF) signal is provided to an electrode within a plasma chamber. The RF signal is used to generate plasma within the plasma chamber. The plasma is used for a variety of operations, e.g., clean substrate placed on a lower electrode, etch a substrate, etc. During processing of the substrate using the plasma, the RF signal transitions between two states.

It is in this context that embodiments described in the present disclosure arise.

SUMMARY

Embodiments of the disclosure provide systems, apparatus, methods and computer programs for multi regime plasma wafer processing to increase directionality of ions. It should be appreciated that the present embodiments can be implemented in numerous ways, e.g., a process, an apparatus, a system, a device, or a method on a computer readable medium. Several embodiments are described below.

In several embodiments, a multi plasma regime scheme is described. In the multi plasma regime scheme, during a state S1, plasma having a high density and a high ion energy is generated or maintained within a plasma chamber. For example, an x kilohertz (kHz) radio frequency (RF) generator supplies power having a power level of 15000 watts and a y megahertz (MHz) RF generator supplies power having a power level of 5000 watts during the state S1. Moreover, during a state S2, the x kHz RF generator supplies low frequency power, such as having a power level ranging from 3000 watts to 15000 watts. The y MHz RF generator does not supply any power or supplies a minimal amount of power during the state S2. To illustrate, the y MHz RF generator is turned off during the state S2. The state S2 produces a high density ion flux with a narrow ion angular distribution (IAD). A more directional high energy ion flux during the state S2 improves an etch profile of a device contact hole, enlarges a critical dimension (CD), such as a mask neck, increases vertical directionality of a profile of ion angular distribution, and increases ion flux to a bottom surface of a stack layer of a wafer to be etched. A high amount of ion flux at the bottom surface results in a higher etch rate. Since the state S2 has high energy ion flux, the state S2 accelerates a loss of mask, which is deposited on top of the stack layer. During a state S3, a polymer is deposited on the stack layer and a rate of loss of mask is reduced compared to that in the state S2.

In some embodiments, a method for increasing directionality of ions of plasma towards a bottom of a stack layer is described. The method includes receiving a digital pulsed signal. The digital pulsed signal has a first state, a second state, and a third state. The method further includes determining whether the digital pulsed signal is transitioning from the third state to the first state and controlling a kHz RF generator to generate a kHz RF signal having a power level during the first state upon determining that the digital pulsed signal is transitioning from the third state to the first state. The method includes controlling a MHz RF generator to generate a MHz RF signal having a power level during the first state upon determining that the digital pulsed signal is transitioning from the third state to the first state. The method includes determining whether the digital pulsed signal is transitioning from the first state to the second state and controlling the kHz RF generator to generate the kHz RF signal having a power level during the second state upon determining that the digital pulsed signal is transitioning from the first state to the second state. The method includes controlling the MHz RF generator to generate the MHz RF signal having a power level during the second state upon determining that the digital pulsed signal is transitioning from the first state to the second state. The power level of the MHz RF signal during the second state is lower than the power level of the MHz RF signal during the first state. The method includes determining whether the digital pulsed signal is transitioning from the second state to the third state and controlling the kHz RF generator to generate the kHz RF signal having a power level during the third state upon determining that the digital pulsed signal is transitioning from the second state to the third state. The power level of the kHz RF signal during the second state is lower than the power level of the kHz RF signal during the first state and the power level of the kHz RF signal during the second state is greater than the power level of the kHz RF signal during the third state to increase the directionality of the ions of the plasma towards the bottom of the stack layer. The method includes controlling the MHz RF generator to generate the MHz RF signal having a power level during the third state upon determining that the digital pulsed signal is transitioning from the second state to the third state.

Some advantages of the herein described multi regime plasma wafer processing to increase directionality of ions include that the state S2 of the x kHz RF generator is used to control a shape of the mask, control a contact etch profile by controlling IAD, and to increase the etch rate or throughput. For example, during the state S2 of the x kHz RF generator, there is an increase in a power level that is supplied by the x kHz RF generator compared to a power level during a low state of a two-state RF generator. The increase in the power level increases the etch rate or throughput while also increasing the vertical directionality of ions that are incident on the bottom surface formed within the stack layer.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for performing multistate plasma processing to increase directionality of ions. It will be apparent that the present embodiments may be practiced without some or all of these specific details. In other instances, well known process operations have not been described in detail in order not to unnecessarily obscure the present embodiments.

Figure 1:
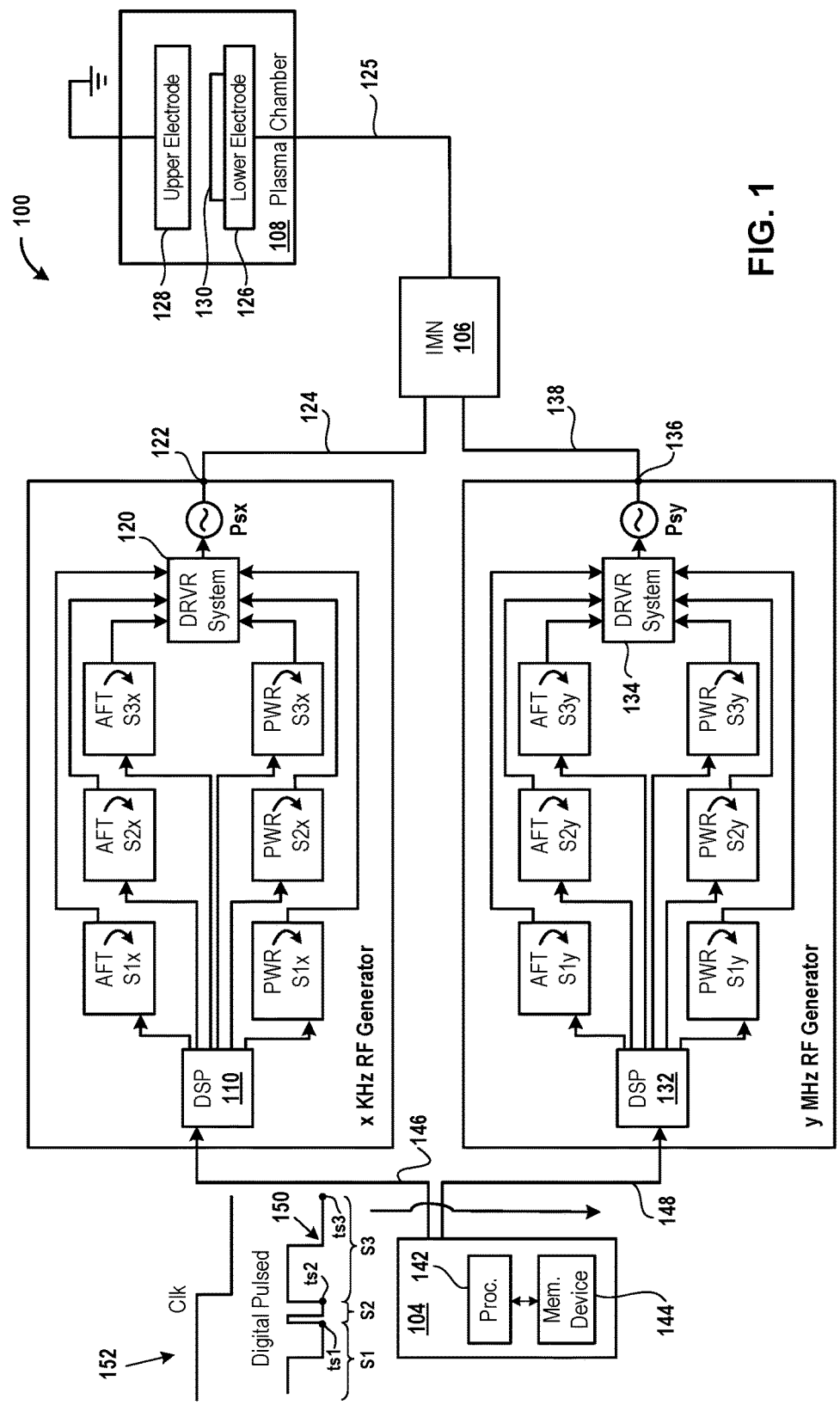
FIG. 1 is a block diagram of an embodiment of a plasma tool for performing multistate plasma processing to increase directionality of ions.

FIG. 1 is a block diagram of an embodiment of a plasma tool 100 for performing multistate plasma processing to increase directionality of ions. The plasma tool 100 includes an x kilohertz (kHz) radio frequency (RF) generator, a y megahertz (MHz) RF generator, a host computer 104, an impedance matching network (IMN) 106, and a plasma chamber 108. The x kHz RF generator is a 400 kilohertz (kHz) RF generator having an operating frequency of 400 kHz. For example, the x kHz RF generator operates at a frequency ranging from 380 kHz to 420 kHz. As another example, the x kHz RF generator operates at a frequency ranging from 370 kHz to 430 kHz. Examples of the y MHz RF generator include a 2 MHz, or a 13.56 MHz, or a 27 MHz, or a 60 MHz RF generator. Examples of the host computer 104 include a desktop computer, or a laptop computer, or a smartphone, or a tablet, etc.

The x kHz RF generator includes a digital signal processor (DSP) 110, a power controller PWRS1$x$, another power controller PWRS2$x$, yet another power controller PWRS3$x$, an auto frequency tuner (AFT) AFTS1$x$, another auto frequency tuner AFTS2$x$, still another auto frequency tuner AFTS3$x$, an RF power supply Psx, and a driver system 120. Examples of an RF power supply, as used herein, include an RF oscillator. To illustrate, an RF power supply is an electronic circuit that produces an oscillating signal, such as a sine wave, at a radio frequency. As another illustration, an RF power supply is a crystal oscillator having a quartz crystal that is distorted at a pre-determined frequency when a voltage is applied to an electrode near or on the quartz crystal. As used herein, a processor is an application specific integrated circuit (ASIC), or a programmable logic device (PLD), or a central processing unit (CPU), or a microprocessor, or a microcontroller. As used herein, a controller is application specific integrated circuit (ASIC), or a programmable logic device (PLD), or a central processing unit (CPU), or a microprocessor, or a microcontroller, or a processor. Examples of a driver system, as used herein, include one or more transistors.

The plasma chamber 108 includes a chuck 126 and an upper electrode 128 that faces the chuck 126. The upper electrode 128 is coupled to a ground potential. The plasma chamber 108 also includes other components (not shown), an upper electrode extension surrounding the upper electrode 128, a lower dielectric ring surrounding the chuck 126, a lower electrode extension surrounding the lower dielectric ring, an upper plasma exclusion zone (PEZ) ring, a lower PEZ ring, etc. The upper electrode 128 is located opposite to and facing the chuck 126, which includes a lower electrode. For example, the chuck 126 includes a ceramic layer that is attached to top of the lower electrode and a facility plate that is attached to bottom of the lower electrode. The lower electrode is made of a metal, e.g., anodized aluminum, alloy of aluminum, etc. Also, the upper electrode 128 is made of a metal, e.g., aluminum, alloy of aluminum, etc.

A substrate 130, e.g., a semiconductor wafer, is supported on an upper surface of the chuck 126. Integrated circuits, e.g., an application specific integrated circuit (ASIC), a programmable logic device (PLD), etc., are developed on the substrate 130 and the integrated circuits are used in a variety of devices, e.g., cell phones, tablets, smart phones, computers, laptops, networking equipment, etc.

The upper electrode 128 includes one or more holes that are coupled to a central gas feed (not shown). The central gas feed receives one or more process gases from a gas supply (not shown). Examples of the one or more process gases include an oxygen-containing gas, such as $O_2$. Other examples of the one or more process gases include a fluorine-containing gas, e.g., tetrafluoromethane ($CF_4$), sulfur hexafluoride ($SF_6$), hexafluoroethane ($C_2F_6$), etc.

The DSP 110 is coupled to the power controllers PWRS1$x$, PWRS2$x$, and PWRS3$x$, and to the auto-frequency tuners AFTS1$x$, AFTS2$x$, and AFTS3$x$. Moreover, the power controllers PWRS1$x$, PWRS2$x$, and PWRS3$x$ and the auto-frequency tuners AFTS1$x$, AFTS2$x$, and AFTS3$x$ are coupled to the driver system 120. The driver system 120 is coupled to the RF power supply Psx. The RF power supply Psx is coupled via an output 122 of the x kHz RF generator to an RF cable 124, which is coupled to an input of the IMN 106.

An output of the IMN 106 is coupled via an RF transmission line 125 to the lower electrode of the chuck 126. The RF transmission line 125 includes a metal rod that is surrounded by an insulator that is further surrounded by a sheath. The metal rod is coupled to a cylinder via an RF strap and the cylinder is coupled to the chuck 126.

The y MHz RF generator includes a DSP 132, a power controller PWRS1$y$, another power controller PWRS2$y$, yet another power controller PWRS3$y$, an auto frequency tuner (AFT) AFTS1$y$, and another auto frequency tuner AFTS2$y$. The y MHz RF generator further includes another auto frequency tuner AFTS3$y$, an RF power supply Psy, and a driver system 134. The DSP 132 is coupled to the power controllers PWRS1y, PWRS2y, and PWRS3y, and to the auto-frequency tuners AFTS1y, AFTS2y, and AFTS3y. Moreover, the power controllers PWRS1y, PWRS2y, and PWRS3y and the auto-frequency tuners AFTS1y, AFTS2y, and AFTS3y are coupled to the driver system 134. The driver system 134 is coupled to the RF power supply Psy. The RF power supply Psy is coupled via an output 136 of the y MHz RF generator to an RF cable 138, which is coupled to another input of the IMN 106. The other input of the IMN 106 to which the RF cable 138 is coupled is different from the input of the IMN 106 to which the RF cable 124 is coupled.

The IMN 106 includes electric circuit components, e.g., inductors, capacitors, resistors, or a combination of two or more thereof, etc. to match an impedance of a load coupled to the output of the IMN 106 with an impedance of a source coupled to the inputs of the IMN 106. For example, the IMN 106 matches an impedance of the plasma chamber 108 and the RF transmission line 125 coupled to the output of the IMN 106 with an impedance of the x kHz RF generator, the RF cable 124, the y MHz RF generator, and the RF cable 138, coupled to the inputs of the IMN 106. In one embodiment, one or more of the electrical circuit components of the IMN 106 are tuned to facilitate a match between an impedance of the load coupled to the output of the IMN 106 with that of the source coupled to the inputs of the IMN 106. The IMN 106 reduces a probability of RF power being reflected in a direction towards the source, such as, from the load towards the source.

The host computer 104 includes a processor 142 and a memory device 144. The processor 142 is coupled to the memory device 144. Examples of a memory device include a random access memory (RAM) and a read-only memory (ROM). To illustrate, a memory device is a flash memory, a hard disk, or a storage device, etc. A memory device is an example of a computer-readable medium. The processor 142 is coupled to the DSP 110 via a cable 146 and is coupled to the DSP 132 via a cable 148. Examples of the cable 146 or the cable 148 include a cable that is used to transfer data in a serial manner, a cable that is used to transfer data in a parallel manner, and a cable that is used to transfer data by applying a universal serial bus (USB) protocol.

A control circuit of the processor 142 is used to generate a pulsed signal 150, e.g., a transistor-transistor logic (TTL) signal, a digital pulsing signal, a square-shaped waveform, a pulsed signal having three duty cycles for three states S1 through S3, etc. Examples of the control circuit of the processor 142 include a TTL circuit.

The pulsed signal 150 includes the states S1, S2, and S3. For example, the state S1 of the pulsed signal 150 has a logic level of one during a portion of a clock cycle of a clock signal 152 and a logic level of zero during another portion of the clock cycle. As another example, the state S2 of the pulsed signal 150 has a logic level of one during a portion of the clock cycle and a logic level of zero during another portion of the clock cycle. As yet another example, the state S3 of the pulsed signal 150 has a logic level of one during a portion of the clock cycle and a logic level of zero during another portion of the clock cycle. In various embodiments, the states S1, S2, and S3 execute once during a clock cycle of the pulsed signal 150 and repeat with multiple clock cycles. For example, the clock cycle includes the states S1 through S3 and another clock cycle of the clock signal 152 includes the states S1 through S3. To illustrate, during a portion of a period of a clock cycle, the state S1 is executed, during another period of the clock cycle, the state S2 is executed, and during remaining portion of the period of the clock cycle, the state S3 is executed.

In some embodiments, each of the states S1 through S3 has a one-third duty cycle. In several embodiments, each of the states S1 through S3 has a different duty cycle than a duty cycle of any of remaining of the states S1 through S3. For example, the state S1 has an a % duty cycle, the state S2 has a duty cycle of b %, and the state S3 has a duty cycle of (100−a−b) %, where a and b are integers and where a is a different number than b.

In various embodiments, instead of the control circuit of the processor 142, a clock source, e.g., a crystal oscillator, etc., is used to generate an analog clock signal, which is converted by an analog-to-digital converter into a digital signal similar to the pulsed signal 150. For example, the crystal oscillator is made to oscillate in an electric field by applying a voltage to an electrode near the crystal oscillator. To illustrate, the crystal oscillator oscillates at a first frequency during a first portion of the clock cycle of the clock signal 152, at a second frequency during a second portion of the clock cycle of the clock signal 152, and at a third frequency during a remaining portion of the clock cycle of the clock signal 152. The third frequency is different from the second frequency, which is different from the first frequency. In some embodiments, the first frequency is the same as the second frequency but is different from the third frequency. In various embodiments, the first frequency is the same as the third frequency but is different from the second frequency. In various embodiments, instead of the processor 142, a digital clock source generates the pulsed signal 150.

The processor 142 accesses a recipe from the memory device 144. Examples of the recipe include a power set point to be applied to the x kHz RF generator for the state S1, a power set point to be applied to the x kHz RF generator for the state S2, a power set point to be applied to the x kHz RF generator for the state S3, a frequency set point to be applied to the x kHz RF generator for the state S1, a frequency set point to be applied to the x kHz RF generator for the state S2, a frequency set point to be applied to the x kHz RF generator for the state S3, a power set point to be applied to the y MHz RF generator for the state S1, a power set point to be applied to the y MHz RF generator for the state S2, a power set point to be applied to the y MHz RF generator for the state S3, a frequency set point to be applied to the y MHz RF generator for the state S1, a frequency set point to be applied to the y MHz RF generator for the state S2, a frequency set point to be applied to the y MHz RF generator for the state S3, a chemistry of the one or more process gases, a gap between the upper electrode 128 and the chuck 126, or a combination thereof.

The processor 142 sends an instruction with the pulsed signal 150 to the DSP 110 via the cable 146. The instruction sent to the DSP 110 via the cable 146 has information regarding the pulsed signal 150, the power set point to be applied to the x kHz RF generator for the state S1, the power set point to be applied to the x kHz RF generator for the state S2, the power set point to be applied to the x kHz RF generator for the state S3, the frequency set point to be applied to the x kHz RF generator for the state S1, the frequency set point to be applied to the x kHz RF generator for the state S2, and the frequency set point to be applied to the x kHz RF generator for the state S3. The information regarding the pulsed signal 150 indicates to the DSP 110 that the RF signal to be generated by the x kHz RF generator is to transition from the state S1 to the state S2 at a transition time ts1 of the clock cycle, that the RF signal is to transition from the state S2 to the state S3 at a transition time ts2 of the clock cycle, and that the RF signal is to transition from the state S3 to the state S1 at a transition time ts3 of the clock cycle. The DSP 110 determines from the instruction that the power set point for the state S1 is to be applied during the state S1 of the pulsed signal 150, the power set point for the state S2 is to be applied during the state S2 of the pulsed signal 150, the power set point for the state S3 is to be applied during the state S3 of the pulsed signal 150, the frequency set point for the state S1 is to be applied during the state S1 of the pulsed signal 150, the frequency set point for the state S2 is to be applied during the state S2 of the pulsed signal 150, and the frequency set point for the state S3 is to be applied during the state S3 of the pulsed signal 150. Moreover, the DSP 110 determines from the instruction and the pulsed signal 150, that the RF signal to be generated by the x kHz RF generator is to transition from the state S1 to the state S2 at the transition time ts1 of the clock cycle, that the RF signal is to transition from the state S2 to the state S3 at the transition time ts2 of the clock cycle, and that the RF signal is to transition from the state S3 to the state S1 at the transition time ts3 of the clock cycle. The transition times ts1 through ts3 repeat for each clock cycle of the clock signal 152.

At the transition time ts3 of the clock cycle of the clock signal 152, the DSP 110 sends the power set point for the state S1 to the power controller PWRS1$x$. Similarly, at the transition time ts1 of the clock cycle of the clock signal 152, the DSP 110 sends the power set point for the state S2 to the power controller PWRS2$x$. Also, at the transition time ts2 of the clock cycle of the clock signal 152, the DSP 110 sends the power set point for the state S3 to the power controller PWRS3$x$. Moreover, at the transition time ts3 of the clock cycle, the DSP 110 sends the frequency set point for the state S1 to the auto-frequency tuner AFTS1$x$. Also, at the transition time is 1 of the clock cycle, the DSP 110 sends the frequency set point for the state S2 to the auto-frequency tuner AFTS2$x$. Moreover, at the transition time ts2 of the clock cycle, the DSP 110 sends the frequency set point for the state S3 to the auto-frequency tuner AFTS3$x$.

Upon receiving the power set point for the state S1, the power controller PWRS1$x$ determines an amount of current corresponding to, e.g., having a one-to-one relationship with, mapped to, linked to, etc., the power set point for the state S1. Based on the amount of current that is to be generated by the driver system 120 during the state S1, the power controller PWRS1$x$ generates a command signal and sends the command signal to the driver system 120. For the state S1, in response to receiving the command signal, the driver system 120 generates and sends a current signal having the amount of current to the RF power supply Psx. The RF power supply Psx, upon receiving the current signal generates the RF signal having the power set point for the state S1 and supplies the RF signal via the output 122 and the RF cable 124 to the input of the IMN 106. The power set point for the state S1 is maintained during the state S1 by the RF power supply Psx.

Similarly, upon receiving the power set point for the state S2, the power controller PWRS2$x$ determines an amount of current corresponding to, e.g., having a one-to-one relationship with, mapped to, linked to, etc., the power set point for the state S2. Based on the amount of current that is to be generated by the driver system 120 during the state S2, the power controller PWRS2$x$ generates a command signal and sends the command signal to the driver system 120. For the state S2, in response to receiving the command signal, the driver system 120 generates and sends a current signal having the amount of current to the RF power supply Psx. The RF power supply Psx, upon receiving the current signal generates the RF signal having the power set point for the state S2 and supplies the RF signal via the output 122 and the RF cable 124 to the input of the IMN 106. The power set point for the state S2 is maintained during the state S2 by the RF power supply Psx.

Moreover, upon receiving the power set point for the state S3, the power controller PWRS3$x$ determines an amount of current corresponding to, e.g., having a one-to-one relationship with, mapped to, linked to, etc., the power set point for the state S3. Based on the amount of current that is to be generated by the driver system 120 during the state S3, the power controller PWRS3$x$ generates a command signal and sends the command signal to the driver system 120. For the state S3, in response to receiving the command signal, the driver system 120 generates and sends a current signal having the amount of current to the RF power supply Psx. The RF power supply Psx, upon receiving the current signal generates the RF signal having the power set point for the state S3 and supplies the RF signal via the output 122 and the RF cable 124 to the input of the IMN 106. The power set point for the state S3 is maintained during the state S3 by the RF power supply Psx.

Moreover, upon receiving the frequency set point for the state S1, the auto-frequency tuner AFTS1$x$ determines an amount of current corresponding to, e.g., having a one-to-one relationship with, mapped to, linked to, etc., the frequency set point for the state S1. Based on the amount of current that is to be generated by the driver system 120 during the state S1, the auto-frequency tuner AFTS1$x$ generates a command signal and sends the command signal to the driver system 120. For the state S1, in response to receiving the command signal, the driver system 120 generates and sends a current signal having the amount of current to the RF power supply Psx. The RF power supply Psx, upon receiving the current signal generates the RF signal having the frequency set point for the state S1 and supplies the RF signal via the output 122 and the RF cable 124 to the input of the IMN 106. The frequency set point for the state S1 is maintained during the state S1 by the RF power supply Psx. The RF signal having the power set point for the state S1 and the frequency set point for the state S1 is the RF signal generated during the state S1.

Similarly, upon receiving the frequency set point for the state S2, the auto-frequency tuner AFTS2$x$ determines an amount of current corresponding to the frequency set point for the state S2. Based on the amount of current that is to be generated by the driver system 120 during the state S2, the auto-frequency tuner AFTS2$x$ generates a command signal and sends the command signal to the driver system 120. For the state S2, in response to receiving the command signal, the driver system 120 generates and sends a current signal having the amount of current to the RF power supply Psx. The RF power supply Psx, upon receiving the current signal generates the RF signal having the frequency set point for the state S2 and supplies the RF signal via the output 122 and the RF cable 124 to the input of the IMN 106. The frequency set point for the state S2 is maintained during the state S2 by the RF power supply Psx. The RF signal having the power set point for the state S2 and the frequency set point for the state S2 is the RF signal generated during the state S2.

Moreover, upon receiving the frequency set point for the state S3, the auto-frequency tuner AFTS3$x$ determines an amount of current corresponding to the frequency set point for the state S3. Based on the amount of current that is to be generated by the driver system 120 during the state S3, the auto-frequency tuner AFTS3$x$ generates a command signal and sends the command signal to the driver system 120. For the state S3, in response to receiving the command signal, the driver system 120 generates and sends a current signal having the amount of current to the RF power supply Psx. The RF power supply Psx, upon receiving the current signal generates the RF signal having the frequency set point for the state S3 and supplies the RF signal via the output 122 and the RF cable 124 to the input of the IMN 106. The frequency set point for the state S3 is maintained during the state S3 by the RF power supply Psx. The RF signal having the power set point for the state S3 and the frequency set point for the state S3 is the RF signal generated during the state S3.

The processor 142 sends an instruction with the pulsed signal 150 to the DSP 132 via the cable 148. The instruction sent to the DSP 132 via the cable 148 has information regarding the pulsed signal 150, the power set point to be applied to the y MHz RF generator for the state S1, the power set point to be applied to the y MHz RF generator for the state S2, the power set point to be applied to the y MHz RF generator for the state S3, the frequency set point to be applied to the y MHz RF generator for the state S1, the frequency set point to be applied to the y MHz RF generator for the state S2, and the frequency set point to be applied to the y MHz RF generator for the state S3. The information regarding the pulsed signal 150 indicates to the DSP 132 that the RF signal to be generated by the y MHz RF generator is to transition from the state S1 to the state S2 at the transition time ts1 of the clock cycle of the clock signal 152, that the RF signal is to transition from the state S2 to the state S3 at the transition time ts2 of the clock cycle, and that the RF signal is to transition from the state S3 to the state S1 at the transition time ts3 of the clock cycle. The DSP 132 parses the instruction and determines from the instruction that the power set point for the state S1 is to be applied during the state S1 of the pulsed signal 150, the power set point for the state S2 is to be applied during the state S2 of the pulsed signal 150, the power set point for the state S3 is to be applied during the state S3 of the pulsed signal 150, the frequency set point for the state S1 is to be applied during the state S1 of the pulsed signal 150, the frequency set point for the state S2 is to be applied during the state S2 of the pulsed signal 150, and the frequency set point for the state S3 is to be applied during the state S3 of the pulsed signal 150. Moreover, the DSP 132 determines from the instruction that the RF signal to be generated by the y MHz RF generator is to transition from the state S1 to the state S2 at the transition time ts1 of the clock cycle, that the RF signal is to transition from the state S2 to the state S3 at the transition time ts2 of the clock cycle, and that the RF signal is to transition from the state S3 to the state S1 at the transition time ts3 of the clock cycle.

At the transition time ts3 of the clock cycle of the clock signal 152, the DSP 132 sends the power set point for the state S1 to the power controller PWRS1y. Similarly, at the transition time ts1 of the clock cycle of the clock signal 152, the DSP 132 sends the power set point for the state S2 to the power controller PWRS2y. Also, at the transition time ts2 of the clock cycle of the clock signal 152, the DSP 132 sends the power set point for the state S3 to the power controller PWRS3y. Moreover, at the transition time ts3 of the clock cycle, the DSP 132 sends the frequency set point for the state S1 to the auto-frequency tuner AFTS1y. Also, at the transition time ts1 of the clock cycle, the DSP 132 sends the frequency set point for the state S2 to the auto-frequency tuner AFTS2y. Moreover, at the transition time ts2 of the clock cycle, the DSP 132 sends the frequency set point for the state S3 to the auto-frequency tuner AFTS3y.

Upon receiving the power set point for the state S1, the power controller PWRS1y determines an amount of current corresponding to, e.g., having a one-to-one relationship with, mapped to, linked to, etc., the power set point for the state S1. Based on the amount of current that is to be generated by the driver system 120 during the state S1, the power controller PWRS1y generates a command signal and sends the command signal to the driver system 134. For the state S1, in response to receiving the command signal, the driver system 134 generates and sends a current signal having the amount of current to the RF power supply Psy. The RF power supply Psy, upon receiving the current signal generates the RF signal having the power set point for the state S1 and supplies the RF signal via the output 136 and the RF cable 138 to the other input of the IMN 106. The power set point for the state S1 is maintained during the state S1 by the RF power supply Psy.

Similarly, upon receiving the power set point for the state S2, the power controller PWRS2y determines an amount of current corresponding to, e.g., having a one-to-one relationship with, mapped to, linked to, etc., the power set point for the state S2. Based on the amount of current that is to be generated by the driver system 134 during the state S2, the power controller PWRS2y generates a command signal and sends the command signal to the driver system 134. For the state S2, in response to receiving the command signal, the driver system 134 generates and sends a current signal having the amount of current to the RF power supply Psy. The RF power supply Psy, upon receiving the current signal generates the RF signal having the power set point for the state S2 and supplies the RF signal via the output 136 and the RF cable 138 to the other input of the IMN 106. The power set point for the state S2 is maintained during the state S2 by the RF power supply Psy.

Moreover, upon receiving the power set point for the state S3, the power controller PWRS3y determines an amount of current corresponding to, e.g., having a one-to-one relationship with, mapped to, linked to, etc., the power set point for the state S3. Based on the amount of current that is to be generated by the driver system 134 during the state S3, the power controller PWRS3y generates a command signal and sends the command signal to the driver system 134. For the state S3, in response to receiving the command signal, the driver system 134 generates and sends a current signal having the amount of current to the RF power supply Psy. The RF power supply Psy, upon receiving the current signal generates the RF signal having the power set point for the state S3 and supplies the RF signal via the output 136 and the RF cable 138 to the other input of the IMN 106. The power set point for the state S3 is maintained during the state S3 by the RF power supply Psy.

Moreover, upon receiving the frequency set point for the state S1, the auto-frequency tuner AFTS1y determines an amount of current corresponding to, e.g., having a one-to-one relationship with, mapped to, linked to, etc., the frequency set point for the state S1. Based on the amount of current that is to be generated by the driver system 134 during the state S1, the auto-frequency tuner AFTS1y generates a command signal and sends the command signal to the driver system 134. For the state S1, in response to receiving the command signal, the driver system 134 generates and sends a current signal having the amount of current to the RF power supply Psy. The RF power supply Psy, upon receiving the current signal generates the RF signal having the frequency set point for the state S1 and supplies the RF signal via the output 136 and the RF cable 138 to the other input of the IMN 106. The frequency set point for the state S1 is maintained during the state S1 by the RF power supply Psy. The RF signal having the power set point for the state S1 and the frequency set point for the state S1 is the RF signal generated by the y MHz RF generator during the state S1.

Similarly, upon receiving the frequency set point for the state S2, the auto-frequency tuner AFTS2y determines an amount of current corresponding to the frequency set point for the state S2. Based on the amount of current that is to be generated by the driver system 134 during the state S2, the auto-frequency tuner AFTS2y generates a command signal and sends the command signal to the driver system 134. For the state S2, in response to receiving the command signal, the driver system 134 generates and sends a current signal having the amount of current to the RF power supply Psy. The RF power supply Psy, upon receiving the current signal generates the RF signal having the frequency set point for the state S2 and supplies the RF signal via the output 136 and the RF cable 138 to the other input of the IMN 106. The frequency set point for the state S2 is maintained during the state S2 by the RF power supply Psy. The RF signal having the power set point for the state S2 and the frequency set point for the state S2 is the RF signal generated by the y MHz RF generator during the state S2.

Moreover, upon receiving the frequency set point for the state S3, the auto-frequency tuner AFTS3y determines an amount of current corresponding to the frequency set point for the state S3. Based on the amount of current that is to be generated by the driver system 134 during the state S3, the auto-frequency tuner AFTS3y generates a command signal and sends the command signal to the driver system 134. For the state S3, in response to receiving the command signal, the driver system 134 generates and sends a current signal having the amount of current to the RF power supply Psy. The RF power supply Psy, upon receiving the current signal generates the RF signal having the frequency set point for the state S3 and supplies the RF signal via the output 136 and the RF cable 138 to the other input of the IMN 106. The frequency set point for the state S3 is maintained during the state S3 by the RF power supply Psy. The RF signal having the power set point for the state S3 and the frequency set point for the state S3 is the RF signal generated by the y MHz RF generator during the state S3.

The input of the IMN 106 receives, at the input, the RF signal generated by the x kHz RF generator via the RF cable 124 from the output 122, receives, at the other input, the RF signal generated by the y MHz RF generator via the RF cable 138 from the output 136, and matches an impedance of the load coupled to the output of the IMN 106 with an impedance of the source coupled to the inputs of the IMN 106 to generate a modified RF signal at the output of the IMN 106. The modified RF signal is sent via the RF transmission line 125 to the lower electrode of the chuck 126. When the one or more process gases are supplied between the upper electrode 128 and the chuck 126 and the modified RF signal is supplied to the lower electrode 120, the one or more process gases are ignited to generate plasma within the plasma chamber 108 or the plasma is maintained within the plasma chamber 108. The plasma is used to process, e.g., etch, deposit materials on, clean, sputter, etc., the substrate 130.

In some embodiments, the terms tuner and controller are used interchangeably herein.

In various embodiments, the power controllers PWRS1x, PWRS2x, and PWRS3x, and the auto-frequency tuners AFTS1x, AFTS2x, and AFTS3x are modules, e.g., portions, etc., of a computer program that is executed by the DSP 110.

In several embodiments, the power controllers PWRS1x, PWRS2x, and PWRS3x, and the auto-frequency tuners AFTS1x, AFTS2x, and AFTS3x are separate integrated circuits that are coupled to an integrated circuit of the DSP 110. For example, the power controller PWRS1x is a first integrated circuit of the x kHz RF generator, the power controller PWRS2x is a second integrated circuit of the x kHz RF generator, the power controller PWRS3x is a third integrated circuit of the x kHz RF generator, the auto-frequency tuner AFTS1x is a fourth integrated circuit of the x kHz RF generator, the auto-frequency tuner AFTS2x is a fifth integrated circuit of the x kHz RF generator, the auto-frequency tuner AFTS3x is a sixth integrated circuit of the x kHz RF generator, and the DSP 110 is a seventh integrated circuit of the x kHz RF generator. Each of the first through sixth integrated circuit of the x kHz RF generator is coupled to the seventh integrated circuit of the x kHz RF generator.

In some embodiments, the power controllers PWRS1y, PWRS2y, and PWRS3y, and the auto-frequency tuners AFTS1y, AFTS2y, and AFTS3y are modules, e.g., portions, etc., of a computer program that is executed by the DSP 132.

In various embodiments, the power controllers PWRS1y, PWRS2y, and PWRS3y, and the auto-frequency tuners AFTS1y, AFTS2y, and AFTS3y are separate integrated circuits that are coupled to an integrated circuit of the DSP 132. For example, the power controller PWRS1y is a first integrated circuit of the y MHz RF generator, the power controller PWRS2y is a second integrated circuit of the y MHz RF generator, the power controller PWRS3y is a third integrated circuit of the y MHz RF generator, the auto-frequency tuner AFTS1y is a fourth integrated circuit of the y MHz RF generator, the auto-frequency tuner AFTS2y is a fifth integrated circuit of the y MHz RF generator, the auto-frequency tuner AFTS3y is a sixth integrated circuit of the y MHz RF generator, and the DSP 110 is a seventh integrated circuit of the y MHz RF generator. Each of the first through sixth integrated circuit of the y MHz RF generator is coupled to the seventh integrated circuit of the y MHz RF generator.

In some embodiments, an example of the state S1 of an RF signal includes the power set point for the state S1 and the frequency set point for the state S1. The power set point for the state S1 is an operational power set point, which is a power level, such as an envelope or a zero-to-peak magnitude, of power amounts of the RF signal during the state S1. The frequency set point for the state S1 is an operational frequency set point, which is a frequency level, such as an envelope or a zero-to-peak magnitude, of frequency values of the RF signal during the state S1. Similarly, an example of the state S2 of the RF signal includes the power set point for the state S2 and the frequency set point for the state S2. The power set point for the state S2 is an operational power set point, which is a power level, such as an envelope or a zero-to-peak magnitude, of power amounts of the RF signal during the state S2. The frequency set point for the state S2 is an operational frequency set point, which is a frequency level, such as an envelope or a zero-to-peak magnitude, of frequency values of the RF signal during the state S2. Moreover, similarly, an example of the state S3 of the RF signal includes the power set point for the state S3 and the frequency set point for the state S3. The power set point for the state S3 is an operational power set point, which is a power level, such as an envelope or a zero-to-peak magnitude, of power amounts of the RF signal during the state S3. The frequency set point for the state S3 is an operational frequency set point, which is a frequency level, such as an envelope or a zero-to-peak magnitude, of frequency values of the RF signal during the state S3.

In various embodiments, three RF generators are coupled to the IMN 106. For example, an additional RF generator is coupled to the IMN 106 via another RF cable (not shown) to yet another input of the IMN 106. The additional RF generator is in addition to the x kHz RF generator and the y MHz RF generator. The yet another input is not the same as the input of the IMN 106 to which the RF cable 124 is coupled or the other input of the IMN 106 to which to the RF cable 138 is coupled. The additional RF generator has the same structure and function as that of the y MHz RF generator except that the additional RF generator has a different operating frequency, e.g., 2 MHz, 27 MHz, 60 MHz, etc., than that of the y MHz RF generator. For example, the y MHz RF generator has an operating frequency of 13.56 MHz and the additional RF generator has an operating frequency of 2 MHz, or 27 MHz, or 60 MHz. The IMN 106 combines the RF signals received from the x kHz RF generator, the y MHz RF generator, and the additional RF generator, and matches an impedance of the load coupled to the output of the IMN 106 with that of the source, e.g., the x kHz RF generator, the y MHz RF generator, the additional RF generator, the RF cable 124, the RF cable 148, and the other RF cable, etc., to generate the modified RF signal at the output of the IMN 106.

In one embodiment, terms impedance matching circuit and impedance matching network are used herein interchangeably.

In some embodiments, the RF transmission line 125 is coupled to the upper electrode 128 and the lower electrode of the chuck 126 is coupled to the ground potential.

In various embodiments, the clock signal 152 is generated by the processor 142 or by a clock source, examples of which are provided above. In some embodiments, the clock signal 152 is provided from the processor 142 via the cable 146 to the DSP 110 and via the cable 148 to the DSP 132.

In some embodiments, instead of the pulsed signal 150 being sent from the processor 142 to the x kHz and y MHz RF generators, the pulsed signal 150 is sent from a master RF generator to a slave RF generator, such as the y MHz RF generator. An example of the master RF generator is the x kHz RF generator. To illustrate, the digital signal processor DSP 110 of the x kHz RF generator receives the pulsed signal 150 from the processor 142 and sends the pulsed signal 150 via a cable, such as a parallel transfer cable, a serial transfer cable, or a USB cable, to the digital signal processor DSP 132 of the y MHz RF generator.

Figure 2:
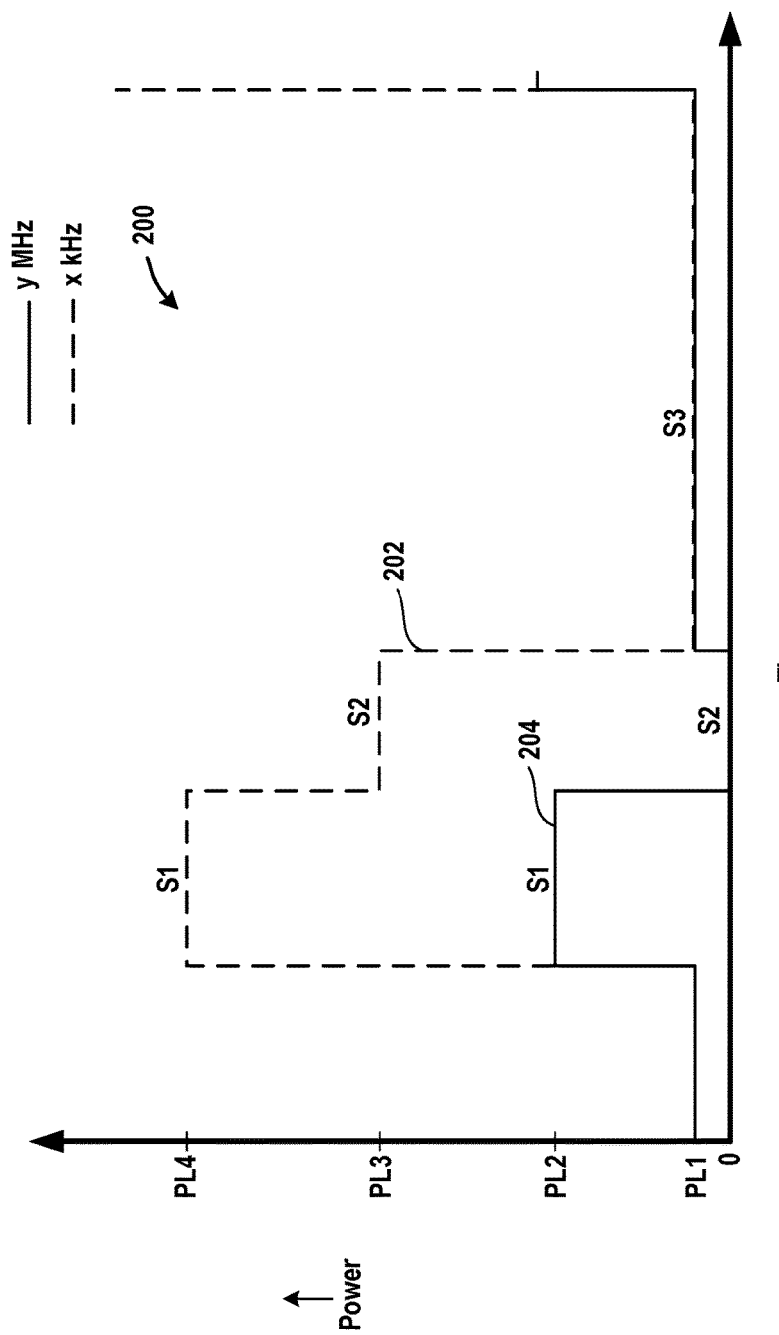
FIG. 2 is a diagram of an embodiment of a graph to illustrate three states of a radio frequency (RF) signal that is generated by a kilohertz (kHz) RF generator and to illustrate the three states of an RF signal that is generated by a megahertz (MHz) RF generator.

FIG. 2 is a diagram of an embodiment of a graph 200 to illustrate the three states S1 through S3 of the RF signal, such as an RF signal 202, that is generated by the x kHz RF generator (FIG. 1) and to illustrate the three states S1 through S3 of the RF signal, such as an RF signal 204, that is generated by the y MHz RF generator. The RF signal 202 is a plot of supplied power at the output 122 of the x kHz RF generator versus time t and the RF signal 204 is a plot of supplied power at the output 136 of the y MHz RF generator versus the time t.

The RF signal that is generated by the x kHz RF generator alternates between the three states S1 through S3 by alternating between the three power set points for the three states S1 through S3. An example of a power set point for a state of the RF signal that is generated by the x kHz RF generator is an envelope of power amounts for the state. Another example of a power set point for a state RF signal that is generated by the x kHz RF generator is a zero-to-peak value of power amounts for the state.

It should be noted that the power set point of the RF signal that is generated by the x kHz RF generator during the state S1 has a power level PL4. Moreover, the power set point of the RF signal that is generated by the x kHz RF generator during the state S2 has a power level PL3, which is lower than the power level PL4 and is greater than a power level PL2 of the RF signal 204 during the state S2. For example, all power amounts of the power level PL3 of the RF signal that is generated by the x kHz RF generator during the state S2 are lower than all power amounts of the power level PL4 of the RF signal that is generated by the x kHz RF generator during the state S1.

Moreover, the power set point of the RF signal that is generated by the x kHz RF generator during the state S3 has a power level PL1, which is lower than the power level PL3 of the RF signal 202 and is lower than the power level PL2 of the RF signal 204. For example, all power amounts of the power level PL1 of the RF signal that is generated by the x kHz RF generator during the state S3 are lower than all power amounts of the power level PL3 of the RF signal that is generated by the x kHz RF generator during the state S2. As an example, a power level of delivered power of the RF signal 202 during the state S1 ranges between 15000 watts (W) and 19000 watts, a power level of delivered power of the RF signal 202 during the state S2 ranges between 8000 watts and 12000 watts, and a power level of delivered power of the RF signal 202 during the state S3 ranges between 200 watts and 400 watts. As another example, a power level of delivered power of the RF signal 202 during the state S1 is 17000 watts (W), a power level of delivered power of the RF signal 202 during the state S2 is 10000 watts, and a power level of delivered power of the RF signal 202 during the state S3 is 300 watts.

The RF signal 204 that is generated by the y MHz RF generator alternates between the three states S1 through S3 by alternating between the three power set points for the three states S1 through S3. An example of a power set point for a state of the RF signal that is generated by the y MHz RF generator is an envelope of power amounts for the state. Another example of a power set point for a state RF signal that is generated by the y MHz RF generator is a zero-to-peak value of power amounts for the state.

Each state of the RF signal 204 is synchronized with each state of the RF signal 202. For example, during a time the RF signal 202 has the state S1, the RF signal 204 has the state S1. During a time the RF signal 202 has the state S2, the RF signal 204 has the state S2. Also, during a time the RF signal 202 has the state S3, the RF signal 204 has the state S3. As yet another example, at a time the RF signal 202 transitions from the state S1 to the state S2, the RF signal 204 transitions from the state S1 to the state S2. As another example, at a time the RF signal 202 transitions from the state S2 to the state S3, the RF signal 204 transitions from the state S2 to the state S3. As yet another example, at a time the RF signal 202 transitions from the state S3 to the state S1, the RF signal 204 transitions from the state S3 to the state S1. As still another example, during a time period in which the RF signal 202 transitions from the state S1 to the state S2, the RF signal 204 transitions from the state S1 to the state S2. As another example, during a time period in which the RF signal 202 transitions from the state S2 to the state S3, the RF signal 204 transitions from the state S2 to the state S3. As yet another example, during a time period in which the RF signal 202 transitions from the state S3 to the state S1, the RF signal 204 transitions from the state S3 to the state S1.

It should be noted that the power set point of the RF signal that is generated by the y MHz RF generator during the state S1 has the power level PL2, which is lower than the power level PL3 and lower than the lower level PL4. Moreover, the power set point of the RF signal that is generated by the y MHz RF generator during the state S2 has a power level of zero, which is lower than the power level PL2. For example, all power amounts of the power level of zero of the RF signal that is generated by the y MHz RF generator during the state S2 are lower than all power amounts of the power level PL2 of the RF signal that is generated by the y MHz RF generator during the state S1. The power level of zero of the y MHz RF generator helps to increase a vertical directionality of the ions of the plasma in the plasma chamber 108 towards a bottom of a stack layer of the substrate 130.

Moreover, the power set point of the RF signal that is generated by the y MHz RF generator during the state S3 has the power level PL1, which is lower than the power level PL2 but greater than the power level of zero. For example, all power amounts of the power level PL1 of the RF signal that is generated by the y MHz RF generator during the state S3 are lower than all power amounts of the power level PL2 of the RF signal that is generated by the y MHz RF generator during the state S1 and greater than all power amounts of the zero power level of the RF signal that is generated by the y MHz RF generator during the state S2. As an example, a power level of delivered power of the RF signal 204 during the state S1 ranges between 4000 watts and 6000 watts, a power level of delivered power of the RF signal 204 during the state S2 ranges between 0 watts and 100 watts, and a power level of delivered power of the RF signal 204 during the state S3 ranges between 200 watts and 400 watts. As another example, a power level of delivered power of the RF signal 204 during the state S1 is 5000 watts, a power level of delivered power of the RF signal 204 during the state S2 is 0 watts, and a power level of delivered power of the RF signal 204 during the state S3 is 300 watts. The same power level PL1 of the x kHz RF generator and the y MHz RF generator during the state S3 facilitates a reduction of a loss of a mask layer on top of the stack layer.

It should be noted that a duty cycle of the state S2 of the RF signals generated by the x kHz RF generators and the y MHz RF generators is lower than a duty cycle of the state S3 of the RF signals. Moreover, a duty cycle of the state S1 of the RF signals generated by the x kHz RF generators and the y MHz RF generators is lower than a duty cycle of the state S3 of the RF signals. As an example, a duty cycle of the state S1 of each of the RF signals 202 and 204 is a % of the clock cycle of the clock signal 152, a duty cycle of the state S2 of each of the RF signals 202 and 204 is b % of the clock cycle of the clock signal 152, and a duty cycle of the state S3 of each of the RF signals 202 and 204 is (100−a−b) % of the clock cycle of the clock signal 152, where a is an integer and b is an integer. As an example, each of a and b has a value less than or equal to 50 and b is less than a. To illustrate, a duty cycle of the state S1 of each of the RF signals 202 and 204 ranges between 20% and 30% of the clock cycle of the clock signal 152, a duty cycle of the state S2 of each of the RF signals 202 and 204 ranges between 5% and 15% of the clock cycle of the clock signal 152, and a duty cycle of the state S3 of each of the RF signals 202 and 204 ranges between 75% and 55% of the clock cycle of the clock signal 152. As another illustration, a duty cycle of the state S1 of each of the RF signals 202 and 204 is 25% of the clock cycle of the clock signal 152, a duty cycle of the state S2 of each of the RF signals 202 and 204 is 10% of the clock cycle of the clock signal 152, and a duty cycle of the state S3 of each of the RF signals 202 and 204 is 65% of the clock cycle of the clock signal 152. To illustrate, a duty cycle of a state is a time period, measured in percentage, of the clock cycle of the clock signal 152 for which the state is maintained. In one embodiment, a duty cycle of the state S2 of the RF signals generated by the x kHz RF and the y MHz RF generators is lower than a duty cycle of the state S1 of the RF signals.

It should be noted that an RF signal that is generated by an RF generator is the same as the RF signal supplied by the RF generator. For example, the RF signal generated by the x kHz RF generator is the same as the RF signal that is supplied by the x kHz RF generator. As another example, the RF signal generated by the y MHz RF generator is the same as the RF signal that is supplied by the y MHz RF generator.

In some embodiments, instead of the power level of zero during the state S2 of the RF signal that is generated by the y MHz RF generator, the power level is within a predetermined range, such as between five to ten percent, from the power level of zero. For example, the power level of the RF signal 202 is lower than the power level PL1 but is greater than zero.

In some embodiments, the amounts of the delivered power are the same as that of power that is generated and supplied by an RF generator. For example, when power that is reflected towards the RF generator is zero or is minimal, power delivered by the RF generator is the same as power that is generated by the RF generator for supply by the RF generator. Delivered power is a difference between power supplied by the RF generator and power that is reflected towards the RF generator. The power is reflected towards the RF generator from the plasma chamber 108 via the RF transmission line 125, the IMN 106, and an RF cable that couples the RF generator to the IMN 106.

Figure 3:
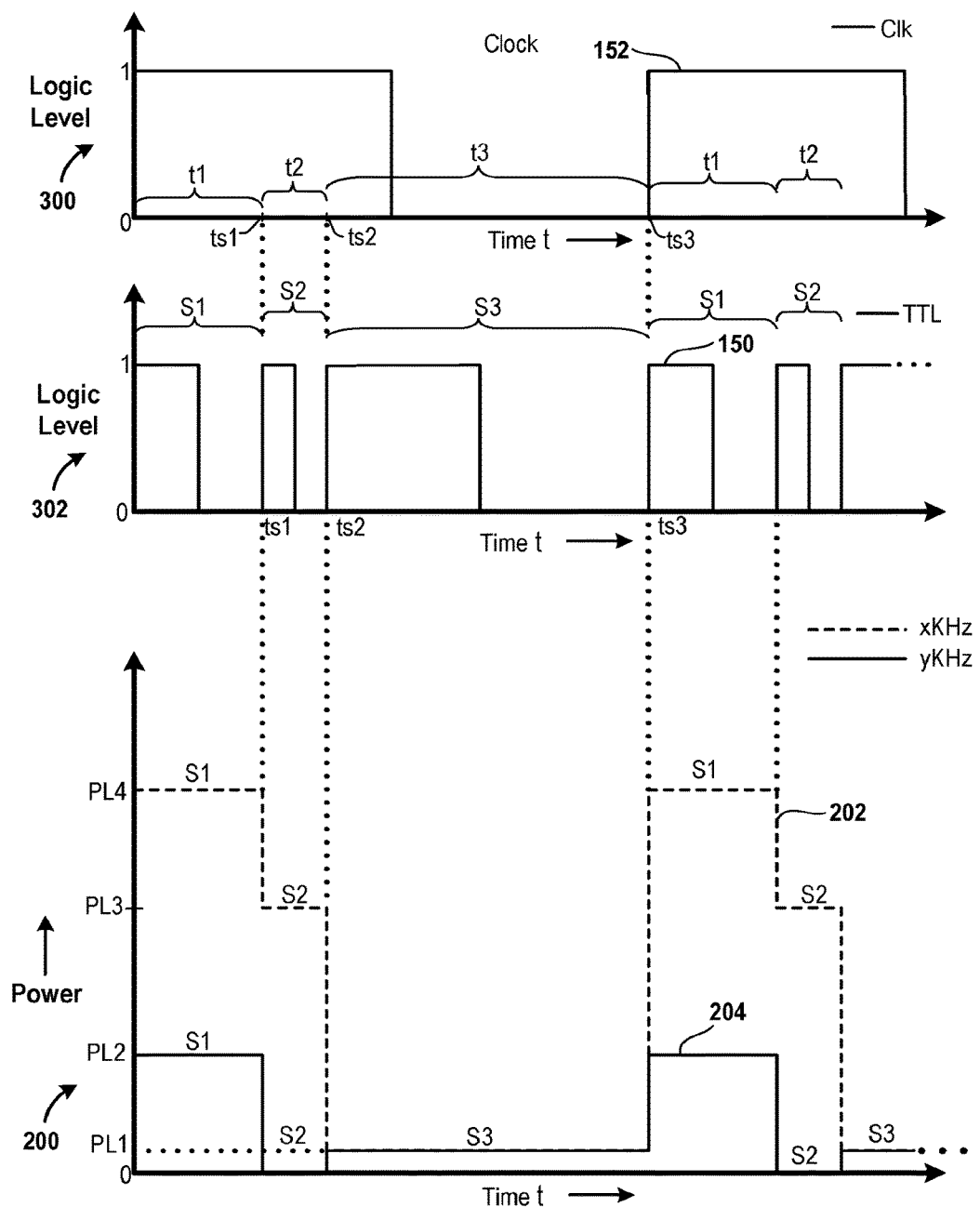
FIG. 3 is a diagram of multiple graphs to illustrate synchronization among a clock signal, a pulsed signal, the RF signal generated by the kHz RF generator, and the RF signal generated by the MHz RF generator.

FIG. 3 is a diagram of multiple graphs 300, 302, and 200 to illustrate synchronization among the clock signal 152, the pulsed signal 150, the RF signal generated by the x kHz RF generator, and the RF signal generated by the z MHz RF generator. The graph 300 plots a logic level of the clock signal 152 versus the time t. Similarly, the graph 302 plots a logic level of the pulsed signal 150 versus the time t.

A time period t1 is a period of time during the clock cycle of the clock signal 152 for which the state S1 of the RF signals generated by the x kHz RF generator and the z MHz RF generator is maintained. Similarly, a time period t2 is a period of time during the clock cycle of the clock signal 152 for which the state S2 of the RF signals generated by the x kHz RF generator and the z MHz RF generator is maintained. Also, a time period t3 is a period of time during the clock cycle of the clock signal 152 for which the state S3 of the RF signals generated by the x kHz RF generator and the z MHz RF generator is maintained. For example, the time period t1 occupies a portion of the clock cycle, the time period t2 occupies another portion of the clock cycle, and the time period t3 occupies the remaining portion of the clock cycle. The time period t1 is greater than the time period t2 and the time period t3 is greater than the time period t2. The time period t3 is greater than the time period t2 to facilitate a reduction of a loss of the mask layer on top of the stack layer. The time period t2 occurs to increase the vertical directionality of ions of plasma towards the bottom of the stack layer. Moreover, the time period t2 occurs so that the loss of the mask layer is reduced compared to the loss of the mask layer occurring during the time period t1. The clock cycle of the clock signal 152 is made of the time periods t1 through t3 and repeats to create multiple clock cycles of the clock signal 152.

During the time period t1, the pulsed signal 150 pulses from a logic level 1 to a logic level 0. The logic level is an example of a high logic level and the logic level 0 is an example of a low logic level. During the time period t1, the RF signals generated by the x kHz RF generator and the z MHz RF generator are controlled to maintain the state S1.

At the transition time ts1 of the clock cycle at which the pulsed signal 150 transitions from the logic level 0 to the logic level 1, the RF signals generated by the x kHz RF generator and the z MHz RF generator are controlled to transition from the state S1 to the state S2. The transition time ts1 occurs after the time period t1.

The time period t2 occurs after the transition time ts1. During the time period t2, the pulsed signal 150 pulses from the logic level 1 to the logic level 0. Moreover, during the time period t2, the RF signals generated by the x kHz RF generator and the z MHz RF generator are controlled to maintain the state S2.

At the transition time ts2 of the clock cycle at which the pulsed signal 150 transitions from the logic level 0 to the logic level 1, the RF signals generated by the x kHz RF generator and the z MHz RF generator are controlled to transition from the state S2 to the state S3. The transition time ts2 occurs after the time period t2.

The time period t3 occurs after the transition time ts2. During the time period t3, the pulsed signal 150 pulses from the logic level 1 to the logic level 0. Moreover, during the time period t3, the RF signals generated by the x kHz RF generator and the z MHz RF generator are controlled to maintain the state S3.

At the transition time ts3 of the clock cycle at which the pulsed signal 150 transitions from the logic level 0 to the logic level 1, the RF signals generated by the x kHz RF generator and the z MHz RF generator are controlled to transition from the state S3 to the state S1. The transition time ts3 occurs after the time period t3. The time period t1 repeats after the transition time ts3 during a consecutive clock cycle of the clock signal 152. The time period t1 during the consecutive clock cycle of the clock signal 152 is again followed by the time periods t2 and t3 of the consecutive clock cycle of the clock signal 152. The consecutive clock cycle of the clock signal 152 is consecutive, such as continuously follows or sequentially follows, the clock cycle of the clock signal 152. The transition times ts1 through ts3 and the time periods t1 through t3 repeat for the consecutive clock cycle. Moreover, the transition times ts1 through ts3 and the time periods t1 through t3 repeat for following cycles of the clock signal 152 that repeat after the consecutive cycle.

The states S1 through S3 of the RF signals 202 and 204 repeat in synchronization with each cycle of the clock signal 152. For example, the states S1 through S3 of the RF signal 202 occur during the clock cycle of the clock signal 152 and the states S1 through S3 repeat during the consecutive clock cycle of the clock signal 152. As another example, the states S1 through S3 of the RF signal 204 occur during the clock cycle of the clock signal 152 and the states S1 through S3 repeat during the consecutive clock cycle of the clock signal 152.

In various embodiments, the states S1 and S2 of the RF signals 202 and 204 occur before half a period of the clock cycle of the clock signal 152 is complete, and the state S3 occurs during the second half of the clock cycle. For example, the states S1 and S2 of the RF signals 202 and 204 occur before a time tc1, and the state S3 of the RF signals 202 and 204 occurs after the time tc1. To illustrate, the transition time ts2 occurs before the time tc1 and the transition time ts3 occurs after the time tc1. The time tc1 is a time of occurrence of half of the clock cycle of the clock signal 152. For example, the clock cycle is at the logic level 1 before the time tc1 and is at the logic level 0 after the time tc1.

In some embodiments, the state S1 of the RF signals 202 and 204 occurs before half a period of the clock cycle of the clock signal 152 is complete, the state S2 of the RF signals 202 and 204 occurs during a transition of the clock signal 152 from a first half of the clock cycle to a second half of the clock cycle, and the state S3 of the RF signals 202 and 204 occurs during the second half of the clock cycle. For example, the state S1 of the RF signals 202 and 204 occurs before the time tc1, the state S2 occurs during a transition of the clock signal 152 from the first half of the clock cycle to the second half of the clock cycle, and the state S3 occurs after the time tc1 but before the transition time ts3.

In several embodiments, the state S1 of the RF signals 202 and 204 occurs during half a period of the clock cycle of the clock signal 152 and the states S2 and S3 of the RF signals 202 and 204 occur during the remaining half of the period of the clock cycle. For example, the states S1 of the RF signals 202 and 204 occur before the time tc1 and the states S2 and S3 of the RF signals 202 and 204 occur after the time tc1 but before the transition time ts3.

In some embodiments, the time period t1 and t2 are equal and the time period t3 is greater than each of the time periods t1 and t2.

Figure 4:
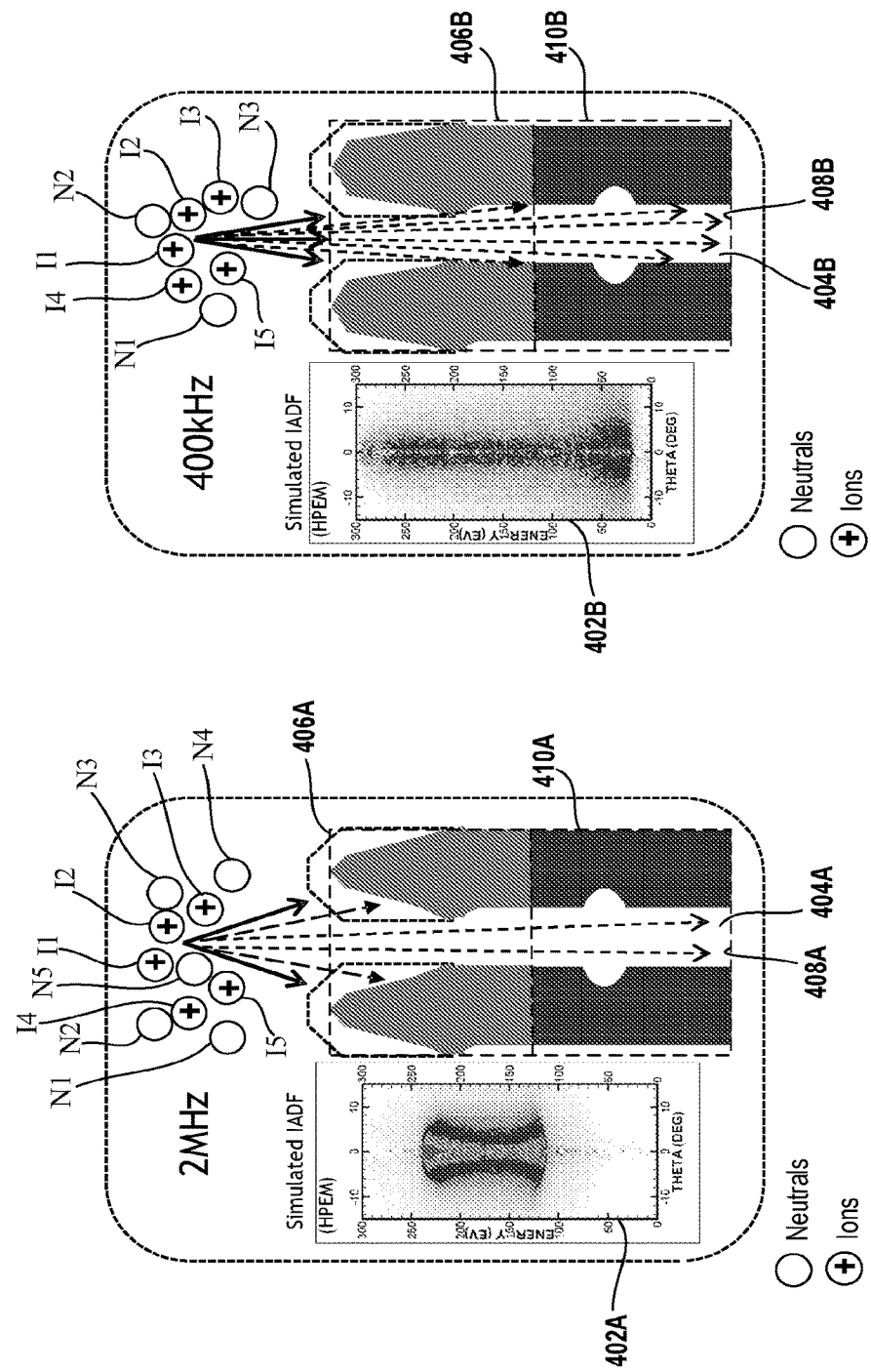
FIG. 4A has a plot illustrating energy distribution in electron volts (eV) of ions of plasma formed within a plasma chamber.
FIG. 4B has a plot illustrating energy distribution of the ions of plasma formed within the plasma chamber.

FIGS. 4A and 4B are diagrams to illustrate a benefit of using the x kHz RF generator instead of a 2 MHz RF generator. FIG. 4A has a plot 402A illustrating energy distribution in electron volts (eV) of ions, such as positively-charged ions I1, I2, I3, I4, and I5, and neutral species N1, N2, N3, N4, and N5, of plasma formed within the plasma chamber 108 between the upper electrode 128 and the chuck 126. The plasma is formed when the 2 MHz RF generator is used instead of the 400 kHz RF generator and the methods described with reference to FIG. 1 are not applied. The energy distribution is plotted versus an angle theta, measured in degrees. The angle theta is measured across a channel 404A formed within a stack layer 410A formed on top of a stop layer, such as a substrate layer. A stack layer, as used herein, includes one or more oxide layers, a barrier layer, a seed layer, one or more metal layers, or a combination thereof. The channel 404A is formed when the ions are incident on the stack layer 410A. It should be noted that when the 2 MHz RF generator is used instead of the x kHz RF generator, a majority of the ions of the plasma are not incident on a bottom surface 408A of the channel 404A. The energy distribution is wide across the channel 404A and so a majority of the ions etch a mask layer 406A fabricated on top of the stack layer 410A.

FIG. 4B has a plot 402B illustrating energy distribution in electron volts of the ions of plasma formed within the plasma chamber 108 between the upper electrode 128 and the chuck 126. The plasma is formed when the x kHz RF generator is used as illustrated in FIG. 1. The energy distribution is plotted versus an angle theta, measured in degrees. The angle theta is measured across a channel 404B formed within a stack layer 410B formed on top of the stop layer. The channel 404B is formed when the ions are incident on the stack layer 410B. It should be noted that when the x kHz RF generator is used as illustrated in the plasma tool 100, a majority of the ions of the plasma are incident on a bottom surface 408B of the channel 404B and an etch rate of etching the channel 404B is increased compared to an etch rate of etching the channel 404A. The energy distribution is narrow across the channel 404B and so a majority of the ions etch the stack layer 410B instead of etching a mask layer 406B formed on top of the stack layer 410B. A combination of the stop layer, the stack layer 410B, and the mask layer 406B is an example of the substrate 130 of FIG. 1.

As illustrated from the plots 402B and 402A, an angular distribution of ion energy of the ions is narrower when the x kHz RF generator is used as is illustrated in FIG. 1 compared to an angular distribution of ion energy when the 2 MHz RF generator is used in place of the x kHz RF generator and compared to when the methods illustrated using FIG. 1 are not applied.

Figure 5:
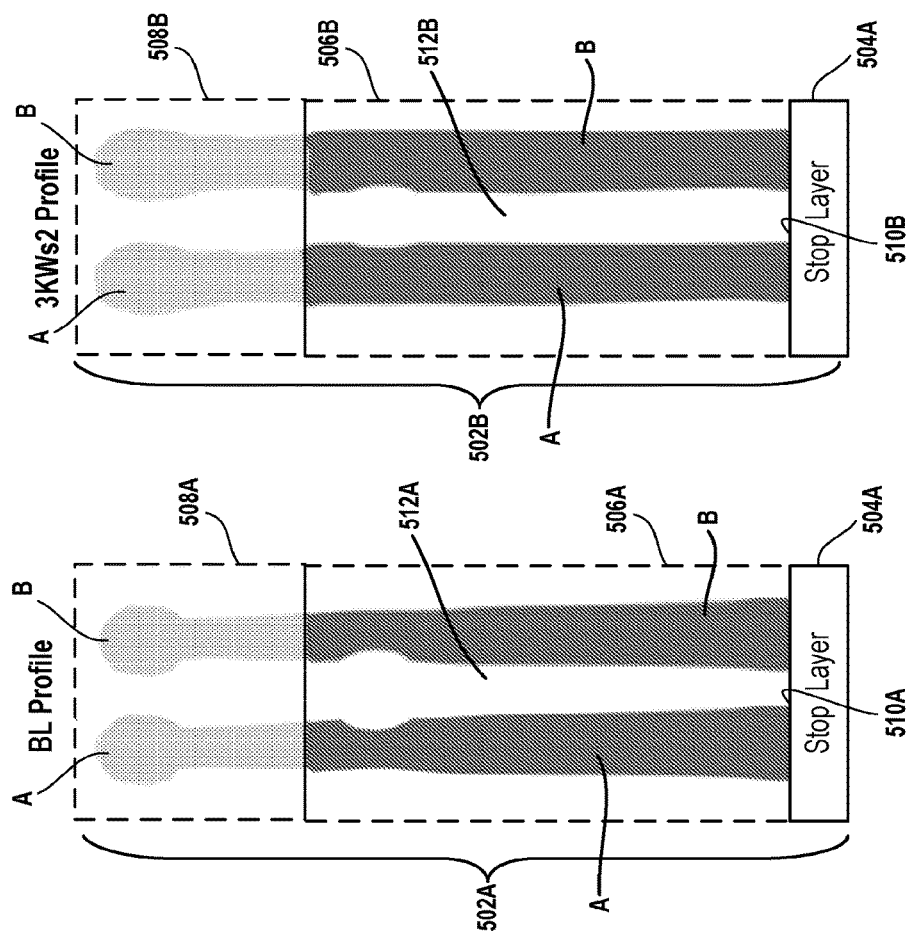
FIG. 5A is a diagram of an embodiment of a substrate when methods described herein with reference to FIG. 1 are not applied.
FIG. 5B is a diagram of an embodiment of a substrate when methods described herein with reference to FIG. 1 are applied.

FIG. 5A is a diagram of an embodiment of a substrate 502A when methods described herein with reference to FIG. 1 are not applied. A baseline profile (BL) is applied when the methods described herein with reference to FIG. 1 are not applied. The substrate 502A includes a stop layer 504A. A stack layer 506A is overlaid on top of the stop layer 504A and a mask layer 508A is overlaid on top of the stack layer 506A. When the baseline profile is applied, a critical dimension, such as a horizontal distance between a portion A and a portion B of the mask layer 508A, is less compared to when the methods illustrated using the plasma tool 100 are applied. As a result, a lower number of the ions are able to reach towards a bottom surface 510A of a channel 512A formed between a portion A of the stack layer 506A and a portion B of the stack layer 506A.

FIG. 5B is a diagram of an embodiment of a substrate 502B when methods described herein with reference to FIG. 1 are applied. The substrate 502B is an example of the substrate 130 (FIG. 1). The substrate 502B includes the stop layer 504A. A stack layer 506B is overlaid on top of the stop layer 504A and a mask layer 508B is overlaid on top of the stack layer 506A. When the methods described herein with reference to FIG. 1 are applied, a critical dimension, such as a horizontal distance between a portion A and a portion B of the mask layer 508B, is greater compared to when the baseline profile is applied. As a result, a greater number of the ions are able to reach towards a bottom surface 510B of a channel 512B formed between a portion A of the stack layer 506B and a portion B of the stack layer 506B. Vertical directionality of the ions is increased when the methods illustrated using the plasma tool 100 of FIG. 1 are applied. The mask layer 508B is etched at a higher rate compared to the mask layer 508A during the state S2 to increase the vertical directionality and an etch rate of etching the channel 512B is increased compared to an etch rate of etching the channel 512A. The loss of the mask layer 508B during the state S2 is recovered during the state S3.

Figure 6:
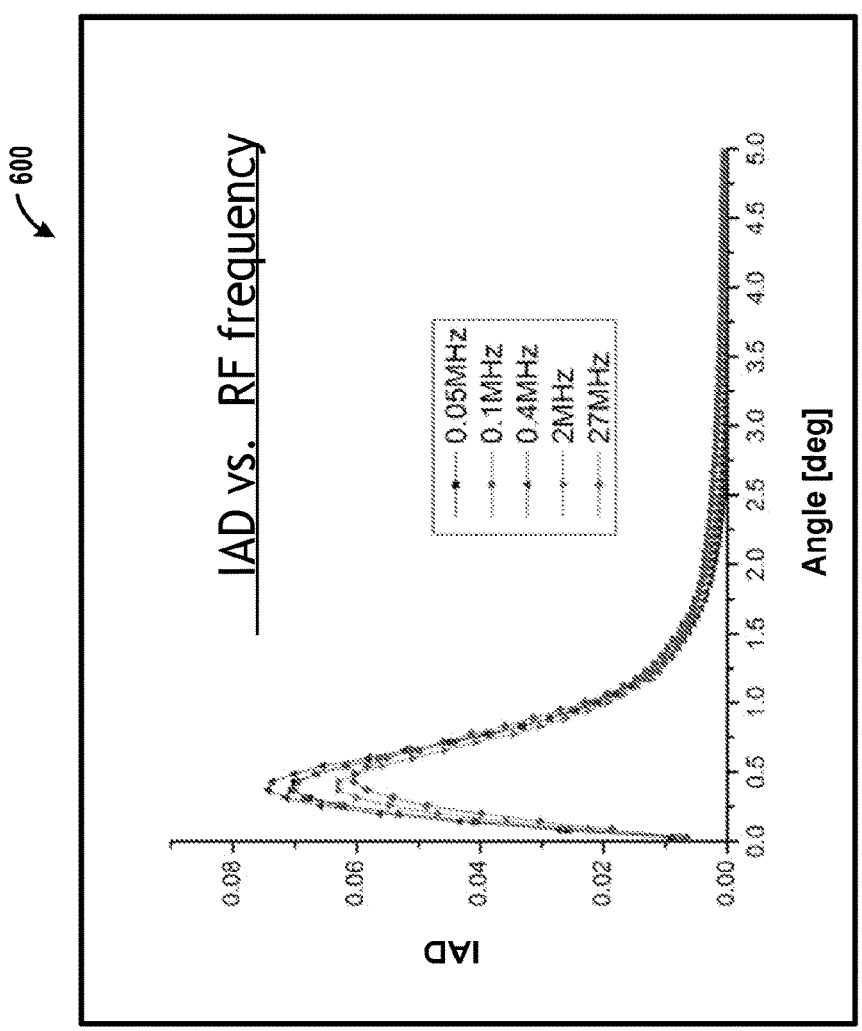
FIG. 6 is an embodiment of a graph to illustrate that an ion angular distribution (IAD) is narrowest when a 400 kHz RF generator is used in a plasma tool of FIG. 1 compared to a 50 kHz RF generator, a 100 kHz RF generator, a 2 MHz RF generator, or a 27 MHz RF generator.

FIG. 6 is an embodiment of a graph 600 to illustrate that an ion angular distribution (IAD) is narrowest when the 400 kHz RF generator is used in the plasma tool 100 compared to when a 50 kHz RF generator, a 100 kHz RF generator, a 2 MHz RF generator, or a 27 MHz RF generator is used in place of the 400 kHz RF generator. The graph 600 plots the IAD versus an angle across the channel 512B of FIG. 5B. When the 400 kHz RF generator is used as illustrated in the plasma tool 100 to apply the methods illustrated using the plasma tool 100, there is an increase in vertical focus, such as vertical directionality, of the ions such that the ions spread over a narrow range of angles within the channel 512B. The increase in the vertical directionality increases an etch rate of etching the substrate 130 compared to when the 50 kHz RF generator, the 100 kHz RF generator, the 2 MHz RF generator, or the 27 MHz RF generator is used in place of the 400 kHz RF generator.

Figure 7:
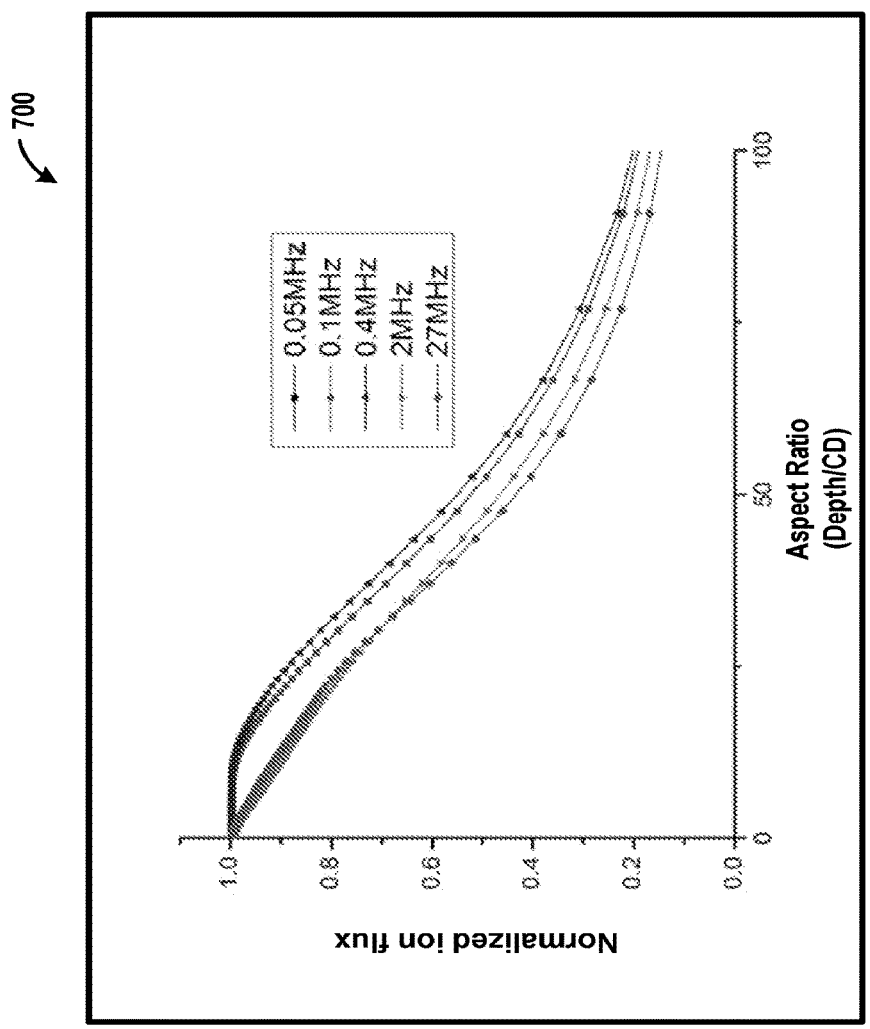
FIG. 7 is an embodiment of a graph to illustrate that the same amount of normalized ion flux of the ions facilitates achieving a higher aspect ratio when the 400 kHz RF generator is used in the plasma tool compared to when the 50 kHz RF generator, the 100 kHz RF generator, the 2 MHz RF generator, or the 27 MHz RF generator is used instead of the 400 kHz RF generator.

FIG. 7 is an embodiment of a graph 700 to illustrate that the same amount of normalized ion flux of the ions facilitates achieving a higher aspect ratio when the 400 kHz RF generator is used in the plasma tool 100 compared to when the 50 kHz RF generator, the 100 kHz RF generator, the 2 MHz RF generator, or the 27 MHz RF generator is used instead of the 400 kHz RF generator. The aspect ratio is higher compared to that achieved when the 50 kHz RF generator, the 100 kHz RF generator, the 2 MHz RF generator, or the 27 MHz RF generator is used instead of the 400 kHz RF generator is used in place of the 400 kHz RF generator.

An aspect ratio is a ratio of depth of a channel to a critical dimension of the channel. For example, the aspect ratio achieved using the 400 kHz RF generator in the plasma tool 100 is a ratio of a depth of the channel 512B versus a horizontal distance between the portions A and B of the mask layer 508B at a neck region of the mask layer 508B. The neck region is located closer to a top surface of the mask layer 508B compared to remaining region of the mask layer 508B. Moreover, the neck region is located away from the stack layer 506B compared to the remaining region of the mask layer 508B. To illustrate, the neck region is at a location at which a bulge is formed in the portions A and B of the mask layer 508B.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A method for increasing directionality of ions of plasma towards a bottom of a stack layer, comprising:

controlling a kilohertz (kHz) radio frequency (RF) generator to generate a kHz RF signal having a power level for a first state, a power level for a second state, and a power level for a third state;

controlling a megahertz (MHz) RF generator to generate a MHz RF signal having a power level for the first state, a power level for the second state, and a power level for the third state, wherein the power level of the MHz RF signal for the first state is lower than the power level of the kHz RF signal for the first state, wherein the power level of the MHz RF signal is approximately zero for the second state, wherein the power level of the MHz RF signal for the third state is less than the power level of the MHz RF signal for the first state and is greater than the power level of the MHz RF signal for the second state, wherein the power level of the kHz RF signal for the second state is lower than the power level of the kHz RF signal for the first state and the power level of the kHz RF signal for the second state is greater than the power level of the kHz RF signal for the third state to increase the directionality of the ions of the plasma towards the bottom of the stack layer for the second state.

2. The method of claim 1, further comprising generating a clock signal, wherein the first state occurs during a first time period of the clock signal, the second state occurs during a second time period of the clock signal, and the third state occurs during a third time period of the clock signal, wherein the second time period is consecutive to the first time period and the third time period is consecutive to the second time period, wherein the third time period is greater than the first time period to facilitate a reduction of a loss of a mask layer on top of the stack layer, wherein the second time period is less than the first time period to facilitate the reduction in the loss of the mask layer, wherein the second time period facilitates the increase in the directionality of the ions.

3. The method of claim 1, wherein the power level of the kHz RF signal for the second state is greater than a power level of a two-state RF signal for a second state, wherein the two-state RF signal has a first state and the second state.

4. The method of claim 1, wherein the kHz RF signal transitions from the power level for the first state to the power level for the second state at the same time at which the MHz RF signal transitions from the power level for the first state to the power level for the second state, wherein the kHz RF signal transitions from the power level for the second state to the power level for the third state at the same time at which the MHz RF signal transitions from the power level for the second state to the power level for the third state.

5. The method of claim 1, wherein the power level of the kHz RF signal for the third state is the same as the power level of the MHz RF signal for the third state to facilitate a reduction of a loss of a mask layer on top of the stack layer of the substrate.

6. The method of claim 1, wherein the power level of the kHz RF signal for the second state is greater than the power level of the MHz RF signal for the first and third states.

7. The method of claim 1, wherein the kHz and the MHz RF generators are coupled via an impedance matching network to an electrode of a plasma chamber.

8. The method of claim 1, wherein the first, second, and third states repeat in synchronization with a clock signal.

9. The method of claim 1, wherein the kHz RF generator is a 400 kHz RF generator and the MHz RF generator is a 60 MHz RF generator.

10. A system for increasing directionality of ions of plasma towards a bottom of a stack layer, comprising:

a kilohertz radio frequency (RF) generator configured to generate a kHz RF signal having a power level for a first state, a power level for a second state, and a power level for a third state;

a megahertz (MHz) RF generator configured to generate a MHz RF signal having a power level for the first state, a power level for the second state, and a power level for the third state;

an impedance matching network coupled to the kHz RF generator and the MHz RF generator, wherein the impedance matching network is configured to receive the kHz RF signal and the MHz RF signal to generate a modified RF signal;

a plasma chamber coupled to the impedance matching network, wherein the plasma chamber is configured to receive the modified RF signal, wherein the power level of the MHz RF generator for the first state is lower than the power level of the kHz RF generator for the first state, wherein the power level of the MHz RF generator is approximately zero for the second state, wherein the power level of the MHz RF generator for the third state is less than the power level of the MHz RF generator for the first state and is greater than the power level of the MHz RF generator for the second state, wherein the power level of the kHz RF signal for the second state is lower than the power level of the kHz RF signal for the first state and the power level of the kHz RF signal for the second state is greater than the power level of the kHz RF signal for the third state to increase the directionality of the ions of the plasma towards the bottom of the stack layer for the second state.

11. The system of claim 10, wherein the first state occurs during a first time period of a clock signal, the second state occurs during a second time period of the clock signal, and the third state occurs during a third time period of the clock signal, wherein the second time period is consecutive to the first time period and the third time period is consecutive to the second time period, wherein the third time period is greater than the first time period to facilitate a reduction of a loss of a mask layer on top of the stack layer, wherein the second time period is less than the first time period to facilitate the reduction in the loss of the mask layer, wherein the second time period facilitates the increase in the directionality of the ions.

12. The system of claim 10, wherein the power level of the kHz RF signal for the second state is greater than a power level of a two-state RF signal for a second state, wherein the two-state RF signal has a first state and the second state.

13. The system of claim 10, wherein the kHz RF signal transitions from the power level for the first state to the power level for the second state at the same time at which the MHz RF signal transitions from the power level for the first state to the power level for the second state, wherein the kHz RF signal transitions from the power level for the second state to the power level for the third state at the same time at which the MHz RF signal transitions from the power level for the second state to the power level for the third state.

14. The system of claim 10, wherein the power level of the kHz RF signal for the third state is the same as the power level of the MHz RF signal for the third state to facilitate a reduction of a loss of a mask layer on top of the stack layer of the substrate.

15. The system of claim 10, wherein the power level of the kHz RF signal for the second state is greater than the power level of the MHz RF signal for the first and third states.

16. The system of claim 10, wherein the first, second, and third states repeat in synchronization with a clock signal.

17. The system of claim 10, wherein the kHz RF generator is a 400 kHz RF generator and the MHz RF generator is a 60 MHz RF generator.

18. A controller system for increasing directionality of ions of plasma towards a bottom of a stack layer, comprising:
   a processor configured to:
      control a kilohertz (kHz) radio frequency (RF) generator to generate a kHz RF signal having a power level for a first state, a power level for a second state, and a power level for a third state;
      control a megahertz (MHz) RF generator to generate a MHz RF signal having a power level for the first state, a power level for the second state, and a power level for the third state,
      wherein the power level of the MHz RF signal for the first state is lower than the power level of the kHz RF signal for the first state,
      wherein the power level of the MHz RF signal is approximately zero for the second state,
      wherein the power level of the MHz RF signal for the third state is less than the power level of the MHz RF signal for the first state and is greater than the power level of the MHz RF signal for the second state,
      wherein the power level of the kHz RF signal for the second state is lower than the power level of the kHz RF signal for the first state and the power level of the kHz RF signal for the second state is greater than the power level of the kHz RF signal for the third state to increase the directionality of the ions of the plasma towards the bottom of the stack layer for the second state; and
   a memory device coupled to the processor for storing the power levels of the kHz RF generator for the first, second, and third states and for storing the power levels of the MHz RF generator for the first, second, and third states.

19. The controller system of claim 18, wherein the processor is configured to generator a clock signal, wherein the first state occurs during a first time period of the clock signal, the second state occurs during a second time period of the clock signal, and the third state occurs during a third time period of the clock signal, wherein the second time period is consecutive to the first time period and the third time period is consecutive to the second time period, wherein the third time period is greater than the first time period to facilitate a reduction of a loss of a mask layer on top of the stack layer, wherein the second time period is less than the first time period to facilitate the reduction in the loss of the mask layer, wherein the second time period facilitates the increase in the directionality of the ions.

20. The controller system of claim 18, wherein the power level of the kHz RF signal for the second state is greater than a power level of a two-state RF signal for a second state, wherein the two-state RF signal has a first state and the second state.

21. The controller system of claim 18, wherein the kHz RF signal transitions from the power level for the first state to the power level for the second state at the same time at which the MHz RF signal transitions from the power level for the first state to the power level for the second state, wherein the kHz RF signal transitions from the power level for the second state to the power level for the third state at the same time at which the MHz RF signal transitions from the power level for the second state to the power level for the third state.

22. The controller system of claim 18, wherein the power level of the kHz RF signal for the third state is the same as the power level of the MHz RF signal for the third state to facilitate a reduction of a loss of a mask layer on top of the stack layer of the substrate.

23. The controller system of claim 18, wherein the power level of the kHz RF signal for the second state is greater than the power level of the MHz RF signal for the first and third states.

24. The controller system of claim 18, wherein the first, second, and third states repeat in synchronization with a clock signal.

25. The controller system of claim 18, wherein the kHz RF generator is a 400 kHz RF generator and the MHz RF generator is a 60 MHz RF generator.

26. The controller system of claim 18, wherein the kHz and the MHz RF generators are coupled via an impedance matching network to an electrode of a plasma chamber.

* * * * *